(12) United States Patent
Shioji

(10) Patent No.: US 10,868,219 B2
(45) Date of Patent: Dec. 15, 2020

(54) METHOD FOR MANUFACTURING SEMICONDUCTOR ELEMENT

(71) Applicant: NICHIA CORPORATION, Anan (JP)

(72) Inventor: Shuji Shioji, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/803,893

(22) Filed: Feb. 27, 2020

(65) Prior Publication Data

US 2020/0203575 A1    Jun. 25, 2020

Related U.S. Application Data

(62) Division of application No. 15/825,106, filed on Nov. 29, 2017, now Pat. No. 10,615,312.

(30) Foreign Application Priority Data

Dec. 2, 2016 (JP) ................... 2016-234596

(51) Int. Cl.
    *H01L 21/00*     (2006.01)
    *H01L 33/46*     (2010.01)
    (Continued)

(52) U.S. Cl.
CPC ........ *H01L 33/46* (2013.01); *H01L 21/02266* (2013.01); *H01L 21/78* (2013.01); *H01L 23/291* (2013.01); *H01L 24/32* (2013.01); *H01L 29/1608* (2013.01); *H01L 33/007* (2013.01); *H01L 33/0093* (2020.05); *H01L 33/405* (2013.01); *H01L 33/60* (2013.01);
(Continued)

(58) Field of Classification Search
CPC .......................... H01L 21/78; H01L 21/02266
See application file for complete search history.

(56) References Cited

U.S. PATENT DOCUMENTS

2009/0242917 A1    10/2009   Inoue et al.
2013/0302512 A1*   11/2013   McEntire ................ A61L 27/50
                                                                                                      427/2.26
(Continued)

FOREIGN PATENT DOCUMENTS

JP     2005-072148     3/2005
JP     2015-106642     6/2015
(Continued)

OTHER PUBLICATIONS

Election of Species Requirement issued by the U.S. Patent and Trademark Office for the parent U.S. Appl. No. 15/825,106, dated Nov. 30, 2018.
(Continued)

*Primary Examiner* — Samuel A Gebremariam
(74) *Attorney, Agent, or Firm* — Mori & Ward, LLP

(57) ABSTRACT

A method for manufacturing a semiconductor element includes providing a semiconductor layer on a carbide substrate, the carbide substrate having a semiconductor layer contact surface connected to the semiconductor layer and a reflective layer contact surface opposite to the semiconductor layer contact surface. A reflective layer is provided on the reflective layer contact surface of the carbide substrate. The reflective layer contains silver and at least one of oxide particles and nitride particles.

17 Claims, 7 Drawing Sheets

(51) Int. Cl.
*H01L 23/00* (2006.01)
*H01L 33/40* (2010.01)
*H01L 29/16* (2006.01)
*H01L 21/02* (2006.01)
*H01L 23/29* (2006.01)
*H01L 33/60* (2010.01)
*H01L 21/78* (2006.01)
*H01L 33/00* (2010.01)
*H01L 33/42* (2010.01)
*H01L 33/32* (2010.01)
*H01L 33/64* (2010.01)

(52) U.S. Cl.
CPC .......... *H01L 33/0095* (2013.01); *H01L 33/32* (2013.01); *H01L 33/42* (2013.01); *H01L 33/641* (2013.01); *H01L 2224/32245* (2013.01); *H01L 2924/15787* (2013.01); *H01L 2933/0016* (2013.01)

(56) References Cited

U.S. PATENT DOCUMENTS

2014/0225862 A1  8/2014  Murata et al.
2015/0155456 A1  6/2015  Kuramoto et al.
2015/0179537 A1  6/2015  Shioji et al.
2015/0327366 A1* 11/2015  Hassan ................... C23C 30/00
                                                       174/254

FOREIGN PATENT DOCUMENTS

JP    2015-144245    8/2015
JP    2016-072361    5/2016
JP    2016-072364    5/2016
JP    2015-162623    9/2017

OTHER PUBLICATIONS

Office Action issued by the U.S. Patent and Trademark Office for the parent U.S. Appl. No. 15/825,106, dated Feb. 7, 2019.
Office Action with Form PTO-892 Notice of References Cited issued by the U.S. Patent and Trademark Office for the parent U.S. Appl. No. 15/825,106, dated Aug. 21, 2019.
Advisory Action issued by the U.S. Patent and Trademark Office for the parent U.S. Appl. No. 15/825,106, dated Nov. 13, 2019.
Notice of Allowance issued by the United States Patent and Trademark Office for the parent U.S. Appl. No. 15/825,106, dated Dec. 18, 2019.

* cited by examiner

METHOD FOR MANUFACTURING SEMICONDUCTOR ELEMENT

CROSS-REFERENCE TO RELATED APPLICATIONS

The present application is a divisional application of the U.S. patent application Ser. No. 15/825,106 filed Nov. 29, 2017, which claims priority under 35 U.S.C. § 119 to Japanese Patent Application No. 2016-234596, filed Dec. 2, 2016. The contents of these applications are incorporated herein by reference in their entirety.

BACKGROUND OF THE INVENTION

Field of the Invention

The present invention relates to a method for manufacturing this semiconductor element.

Discussion of the Background

For example, a semiconductor light emitting element is known in which a semiconductor light emitting structure and electrodes are formed on a substrate, and the resulting semiconductor light emitting element is mounted on a mounting board via eutectic solder. There is a method in which, when the substrate side of the light emitting element is fixed to the mounting board, for example, in order to increase the output of light in the semiconductor light emitting element, a reflective layer is provided on the back of the substrate, thereby improving the reflectivity of light to the element structure side, and increasing the light takeoff efficiency.

For example, JP-A 2005-72148 discloses a nitride-based semiconductor element including a reflective layer which is composed of a metal material such as silver and which is disposed on the rear face of a crystal substrate such as sapphire or SiC, an adhesive layer provided between the crystal substrate and the reflective layer, and a protective layer provided on the reflective layer opposite to the adhesive layer.

SUMMARY OF THE INVENTION

According to an embodiment of the present disclosure, a method for manufacturing a semiconductor element includes providing a semiconductor layer on a carbide substrate, the carbide substrate having a semiconductor layer contact surface connected to the semiconductor layer and a reflective layer contact surface opposite to the semiconductor layer contact surface. A reflective layer is provided on the reflective layer contact surface of the carbide substrate. The reflective layer contains silver and at least one of oxide particles and nitride particles.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1A:
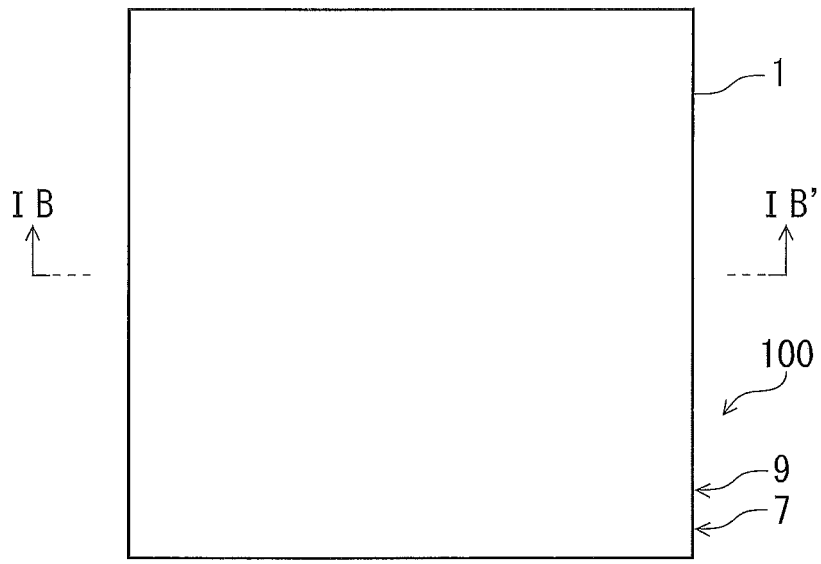
FIG. 1A is a schematic bottom view showing the configuration of the semiconductor light emitting element according to a first embodiment.

The embodiments will now be described with reference to the accompanying drawings, wherein like reference numerals designate corresponding or identical elements throughout the various drawings.

First Embodiment

Embodiments will now be described through reference to the drawings. However, the modes given below are illustrative of a semiconductor element for embodying the technical idea of these embodiments, and embodiments are not limited to those that follow. Also, unless otherwise specified, the dimensions, materials, shapes, relative layouts, and so forth of the constituent elements given in the following embodiments are merely illustrative and are not intended to limit the scope of the present invention. Furthermore, the sizes, positional relations, and so forth of the members shown in the drawings may be exaggerated for clarity.

Semiconductor Element

Figure 1B:
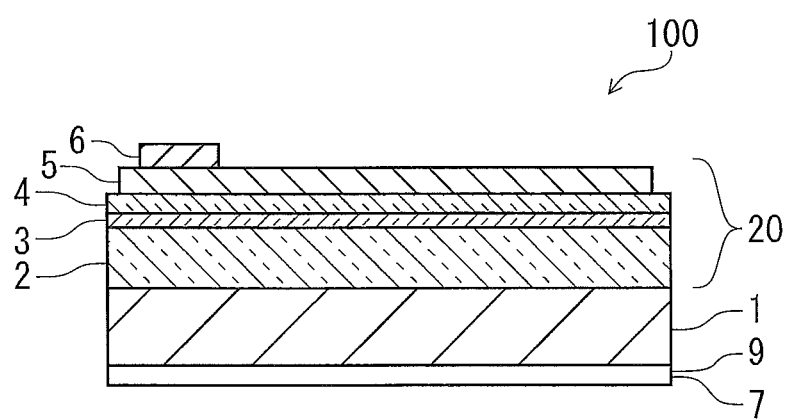
FIG. 1B is a schematic cross section showing the configuration of the semiconductor light emitting element according to the first embodiment, and is a cross section along IB-IB' line in FIG. 1A.
Figure 3A:
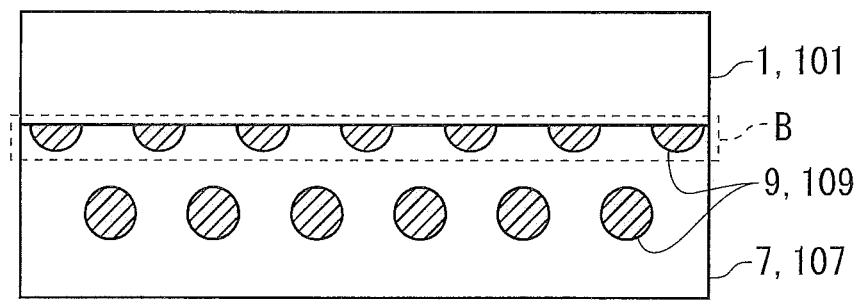
FIG. 3A is a schematic detail cross section of the state of an oxide or a nitride and the interface between the carbide substrate and the reflective layer of the semiconductor light emitting element according to the first and second embodiments.
Figure 3B:
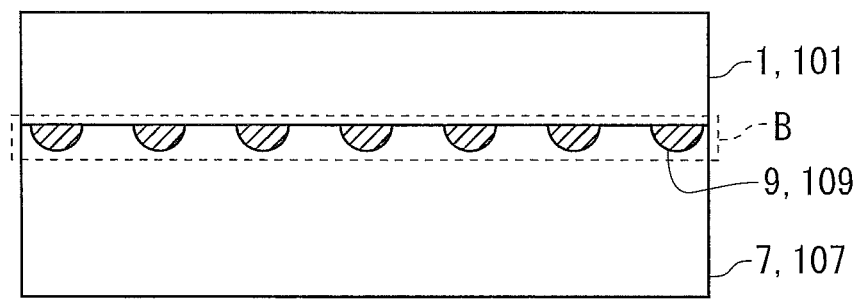
FIG. 3B is a schematic detail cross section of the state of an oxide or a nitride and the interface between the carbide substrate and the reflective layer of the semiconductor light emitting element according to the first and second embodiments.

First, the semiconductor element according to the first embodiment will be described. The semiconductor element according to the first embodiment is a semiconductor light emitting element, FIG. 1A is a schematic bottom view showing the configuration of the semiconductor light emitting element according to the first embodiment. FIG. 1B is a schematic cross section showing the configuration of the semiconductor light emitting element according to the first embodiment, and is a cross section along IB-IB' line in FIG. 1A. FIGS. 3A and 3B are schematic detail cross sections of the state of an oxide or a nitride and the interface between the carbide substrate and the reflective layer of the semiconductor light emitting element according to the first and second embodiments. In FIGS. 3A and 3B, the state of the oxide or nitride in the reflective layer is depicted in schematic form to make it easier to understand. Further, the part labeled B in FIGS. 3A and 3B is a schematic view of a pseudo transition layer.

Semiconductor Layer and Electrode

A semiconductor light emitting element 100 includes an n-type nitride semiconductor layer 2, a light emitting layer 3, a p-type nitride semiconductor layer 4, and a p-side full-surface electrode 5, on a first main face of a carbide substrate 1. The semiconductor light emitting element 100 also includes a p-side pad electrode 6 in a partial region on the p-side full-surface electrode 5. The p-type nitride semiconductor layer 4, the p-side full-surface electrode 5, and the p-side pad electrode 6 are electrically connected. Also, a reflective layer 7 that also serves as an n-side full surface electrode is provided on a second main face opposite to the first main face of the carbide substrate 1. The reflective layer 7 that also serves as an n-side full surface electrode is electrically connected to the n-type nitride semiconductor layer 2.

$In_XAl_YGa_{1-X-Y}N$ ($0 \leq X$, $0 \leq Y$, $X+Y<1$) or the like can be used to advantage as the material of the semiconductor layer, for example. The p-side full-surface electrode 5 is formed from a conductive oxide. Examples of conductive oxides include oxides of one or more members of the group consisting of zinc, indium, tin, and magnesium, and more specific examples include ZnO, $In_2O_3$, $SnO_2$, and indium tin oxide (ITO). The material of the p-side pad electrode 6 can be, for example, silver, aluminum, nickel, rhodium, titanium, platinum, palladium, molybdenum, chromium, tungsten, copper, gold, or another such elemental metal, or alloys whose main components are these metals. Alternatively, it can also be a laminated structure made from the above-mentioned elemental metals or an alloy whose main components are these metals.

Carbide Substrate

There are no particular restrictions on the carbide substrate 1, but an SiC substrate is an example of a substrate on which a nitride semiconductor is grown, for example.

The front (first main face) or rear (second main face) of the carbide substrate 1 may be flat, but it may be worked into a textured shape to enhance the light takeoff efficiency. The semiconductor layer may also be formed on the first main face of the carbide substrate 1 via a mask layer, a buffer layer, an intermediate layer, or the like.

Reflective Layer

The reflective layer 7 is a silver alloy layer containing one or more type of particles selected from among oxides and nitrides, and is a layer for improving the light takeoff efficiency by increasing the reflectivity of light to the element structure side. The reflective layer 7 also functions as an n-side full-surface electrode. The particles contained in the silver alloy layer may be only oxide particles or only nitride particles, but may also be a mixture of oxide particles and nitride particles. These particles will be referred to as the "oxide or nitride 9" here. The reflective layer 7 is preferably provided over the entire lower face of the carbide substrate 1. The oxide or nitride 9 is uniformly dispersed in the reflective layer 7. Since the reflective layer 7 includes the oxide or nitride 9, a pseudo transition layer in which both the oxide or nitride 9 and the silver in the reflective layer 7 are present will be provided at the interface between the reflection layer 7 and the carbide substrate 1. Providing this pseudo transition layer improves adhesion between the carbide substrate 1 and the reflective layer 7, and gives a semiconductor light emitting element 100 with higher reliability.

Here, saying that both the oxide or nitride 9 and the silver in the reflective layer 7 are present at the interface between the reflection layer 7 and the carbide substrate 1 refers to a state in which part of the oxide or nitride 9 is present at the interface, and the oxide or nitride 9 is in contact with the carbide substrate 1 along with the silver. Also, "pseudo transition layer" does not mean that a layer is actually formed, and merely refers to a state in which the presence of silver and the oxide or nitride 9 at the interface allows these to approximate a layer formed at the interface.

Also, when the oxide or nitride 9 is present in the reflective layer 7, this results in a pinning effect, which suppresses the growth of crystal grains of the silver that is the main component of the reflective layer 7. This makes it less likely that crystal grains will grow due to the heat history from the step of assembling the semiconductor element, which keeps the surface of the reflective layer 7 smooth, or suppresses the generation of voids in the reflective layer 7. Therefore, the reflective layer 7 is more likely to maintain high reflectivity and heat dissipation.

The oxide or nitride 9 is dispersed in particulate form in the reflective layer 7, or adheres to the interface between the reflective layer 7 and the carbide substrate 1. Here, the oxide or nitride 9 adhering to the interface between the reflection layer 7 and the carbide substrate 1 does not form a layer of just the oxide or nitride 9, and part of the silver must be in contact with the carbide substrate 1. However, as long as some of the silver is in contact with the carbide substrate 1, the oxide or nitride 9 may be linked in a reticulated form. When the added amount of oxide or nitride 9 is small, there will tend to be little adhesion of the oxide or nitride 9 at the interface, and the oxide or nitride 9 resulting in a pseudo transition layer in which the oxide or nitride 9 is formed as islands. The term "islands" means that the oxide or nitride 9 is not contiguous, and is instead present as dots here and there. Here again, since the oxide or nitride 9 and the silver are both present, it can be said that a pseudo transition layer is formed.

The oxide or nitride 9 in the reflective layer 7 is preferably one or more substances selected from among $Si_3N_4$, ZnO, $TiO_2$, $Ta_2O_5$, $HfO_2$, $In_2O_3$, $Nb_2O_5$, $SiO_2$, AlN, $SnO_2$, NiO, $Al_2O_3$, $ZrO_2$, $Ga_2O_3$, and GaN. From the standpoint of adhesion to the carbide substrate 1, the oxide or nitride 9 in the reflective layer 7 is more preferably one or more substances selected from among $Si_3N_4$, ZnO, $TiO_2$, $Ta_2O_5$, $HfO_2$, and $In_2O_3$.

It is preferable that the content of the oxide or nitride 9 in the reflective layer 7 is greater than 0.001 wt % with respect to the total weight of the reflective layer 7. Having the oxide or nitride 9 exceed 0.001 wt % improves the adhesion between the reflective layer 7 and the carbide substrate 1. From the standpoint of adhesion to the carbide substrate 1, the content of the oxide or nitride 9 in the reflective layer 7 is preferably at least 0.01 wt %, and more preferably at least 0.02 wt %. Also, from the standpoint of the reflectivity (initial reflectivity) of the reflective layer 7, the content of the oxide or nitride 9 in the reflective layer 7 is preferably no more than 5 wt %, more preferably no more than 4 wt %, and even more preferably no more than 2.5 wt %.

The higher is the transparency of the oxide or nitride 9 contained in the reflective layer 7, the higher is the reflectivity, so the higher is the transparency of the oxide 9, the more the content of the oxide or nitride 9 may be increased.

The content of the oxide or nitride 9 in the reflective layer 7 can be measured by inductively coupled plasma atomic emission spectrometry (ICP-AES) or the like.

Operation of Semiconductor Light Emitting Element

The operation of the semiconductor light emitting element 100 will now be described through reference to FIG. 1B.

With the semiconductor light emitting element 100, the light emitting layer 3 emits light when current is supplied to a semiconductor layer 20 via the reflective layer 7 and the p-side pad electrode 6. The light emitted from the light emitting layer 3 propagates through the semiconductor layer 20 and the carbide substrate 1, and light traveling upward in the drawing is taken off to the outside from the semiconductor layer 20 side (element structure side). Light traveling downward in the drawing is reflected upward by the reflecting layer 7 and taken off from semiconductor layer 20 side to the outside.

Method for Manufacturing Semiconductor Light Emitting Element

Figure 4:
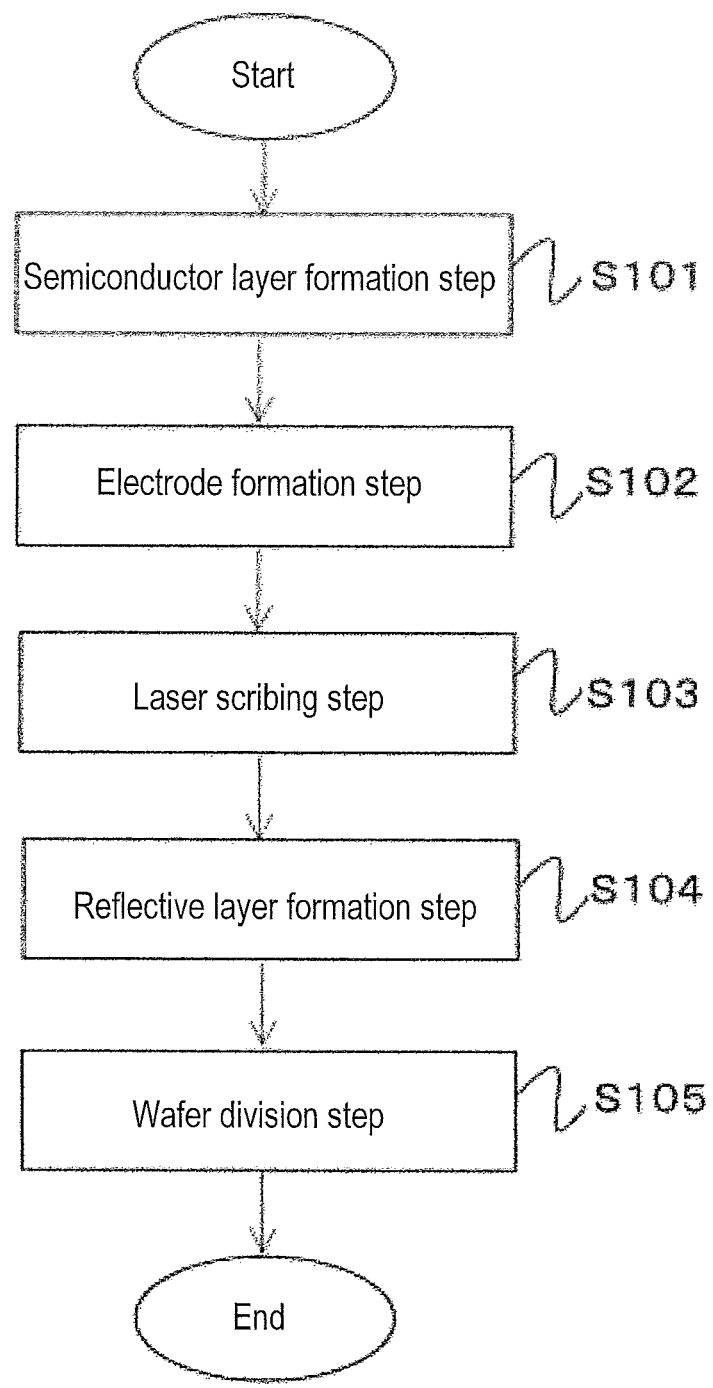
FIG. 4 is a flowchart showing the flow of the method for manufacturing the semiconductor light emitting element according to the first embodiment.
Figure 5A:
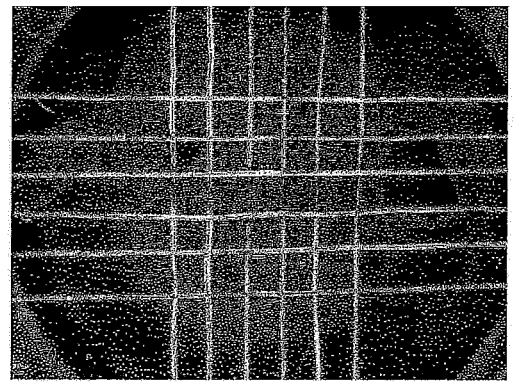
FIG. 5A is a photograph of the sample in Working Example 1 taken from the film formation side.
Figure 5B:
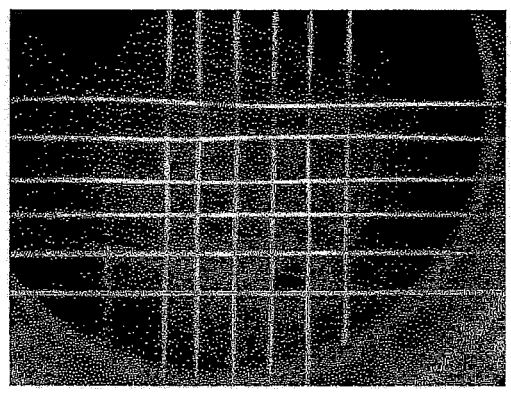
FIG. 5B is a photograph of the sample in Working Example 2 taken from the film formation side.
Figure 5C:
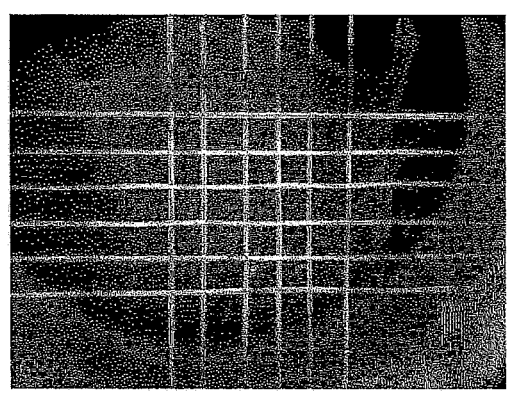
FIG. 5C is a photograph of the sample in Working Example 3 taken from the film formation side.
Figure 5D:
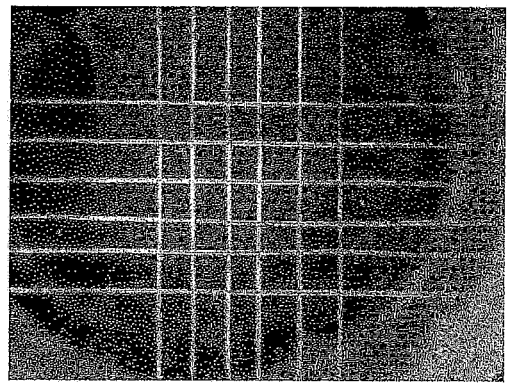
FIG. 5D is a photograph of the sample in Working Example 4 taken from the film formation side.
Figure 5E:
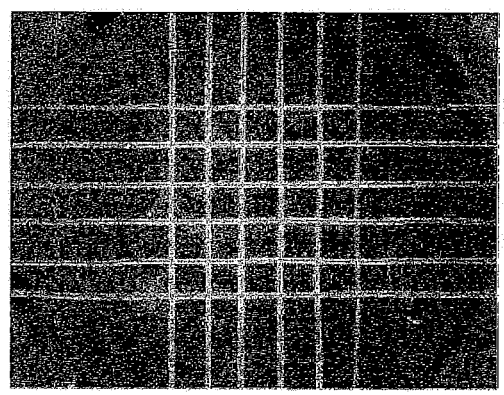
FIG. 5E is a photograph of the sample in Working Example 5 taken from the film formation side.
Figure 5F:
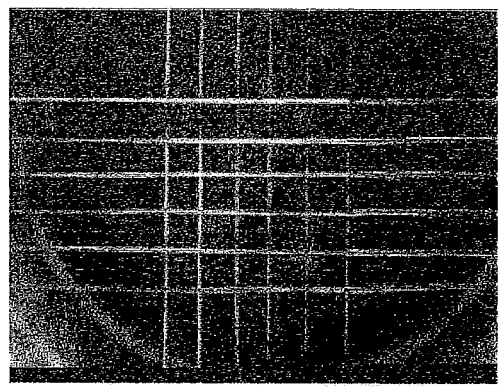
FIG. 5F is a photograph of the sample in Working Example 6 taken from the film formation side.
Figure 5G:
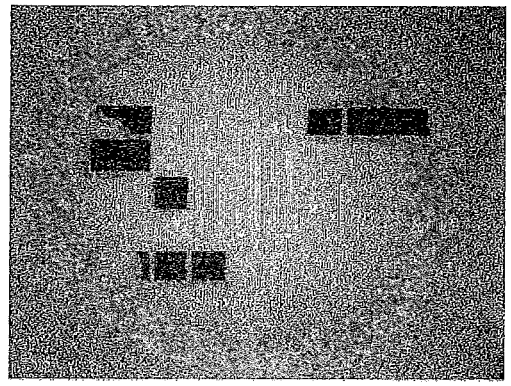
FIG. 5G is a photograph of the sample in Comparative Example 1 taken from the film formation side.
Figure 5H:
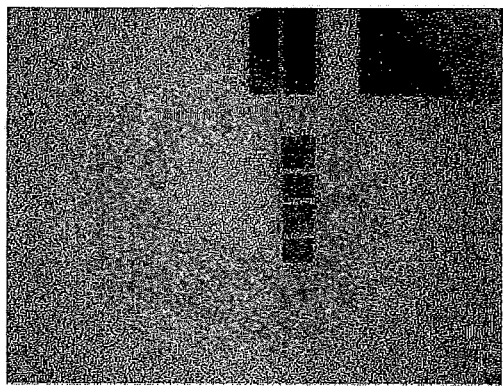
FIG. 5H is a photograph of the sample in Comparative Example 2 taken from the film formation side.

Next, a method for manufacturing the semiconductor light emitting element according to the first embodiment will be described. FIG. 4 is a flowchart showing the flow in the method for manufacturing a semiconductor light emitting element according to the first embodiment.

The method for manufacturing the semiconductor light emitting element 100 in the first embodiment includes, for example, a semiconductor layer formation step S101, an electrode formation step S102, a laser scribing step S103, a reflective layer formation step S104, and a wafer division step S105, in that order. The materials, layout, and so forth of the various members is the same as in the above description of the semiconductor light emitting element 100, and therefore may not be described again.

Semiconductor Layer Formation Step, Electrode Formation Step

The semiconductor layer formation step S101 is a step of forming the semiconductor layer 20 on the first main face of the carbide substrate 1, which includes a first main face and a second main face opposite to the first main face. The electrode formation step S102 is a step of forming electrodes, such as the p-side full-surface electrode 5 and the p-side pad electrode 6, on the semiconductor layer 20. The semiconductor layer 20 and the electrodes are formed by a known manufacturing method; for example, they can be forming by the following method.

The semiconductor layer 20 is produced by using an MOVPE reaction device to grow semiconductors that will constitute the n-type nitride semiconductor layer 2, the light emitting layer 3, and the p-type nitride semiconductor layer 4, in that order, on the first main face of the carbide substrate 1.

After this, an ITO film, for example, is formed as the p-side full-surface electrode 5 with a sputtering device over the entire surface of the wafer. A resist mask is then formed and etching is performed so as to leave the ITO film on almost the entire surface of the p-type nitride semiconductor layer 4, after which the resist is removed. Next, a mask that is open in specific regions over the p-side full-surface electrode 5 is formed with a photoresist. A sputtering device is then used to form a metal film continuously and sequentially for a pad electrode over the wafer. The resist is then removed (lift-off) to form the p-side pad electrode 6. After this, the wafer is ground or polished on a different side from the side on which the p-side pad electrode 6 was formed, to smooth out any bumps.

Laser Scribing Step

The laser scribing step S103 is a step of producing the sites where the wafer is to be diced by laser irradiation (cutting regions). First, the wafer to be diced is irradiated with laser light from the carbide substrate 1 side so as to focus on the interior of the carbide substrate 1 in the cutting regions. This form modified portions inside the substrate 1. These modified portions are breaking grooves extending in the thickness direction of the substrate 1, that is, a direction substantially perpendicular to the first main face of the substrate 1. An example of the laser light used here is a femtosecond laser.

Reflective Layer Formation Step

The reflective layer formation step S104 is a step of forming the reflective layer 7, containing the oxide or nitride 9 and having silver as its main component, on the second main face of the carbide substrate 1.

An example in which an oxide is contained in the reflective layer 7 will be described. If a nitride is to be used, just replace "oxide" with "nitride." For example, the layer can be formed by co-sputtering using an oxide target and a silver target, sputtering using an alloy target containing silver and an oxide, or vapor deposition using an alloy vapor deposition material containing silver and an oxide. These sputtering and vapor deposition methods can be used to form a reflective layer 7 in which an oxide is dispersed in the reflective layer 7.

The alloy used for the alloy target or alloy vapor deposition material has silver as its main component, and is an alloy that includes the oxide 9 in silver. Here, the oxide 9 is dispersed as nanoparticles in the silver. In addition to the use of an alloy vapor deposition material, the vapor deposition can be performed using a method in which the reflective layer 7 is formed by using a vapor deposition material composed of silver and a vapor deposition material composed of the oxide 9, and simultaneously vapor depositing these materials. The silver used in the sputtering or vapor deposition can also be pure silver.

The other conditions, procedures, and so forth entailed in sputtering or vapor deposition can be the same as in known methods.

Wafer Division Step

Next, the wafer is cut in the cutting regions and the individual semiconductor light emitting elements are divided into chips. The wafer division step S105 is a step of dividing the wafer on which the semiconductor layer 20, the electrodes, and the reflective layer 7 are formed into chips.

The semiconductor light emitting element 100 can be manufactured through the above steps.

Second Embodiment

Figure 2A:
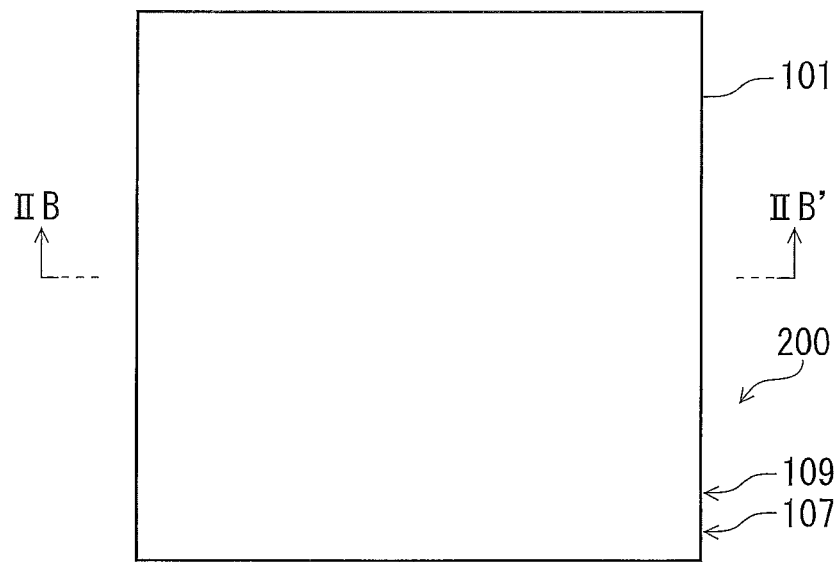
FIG. 2A is a schematic bottom view showing the configuration of the semiconductor light emitting element according to a second embodiment.
Figure 2B:
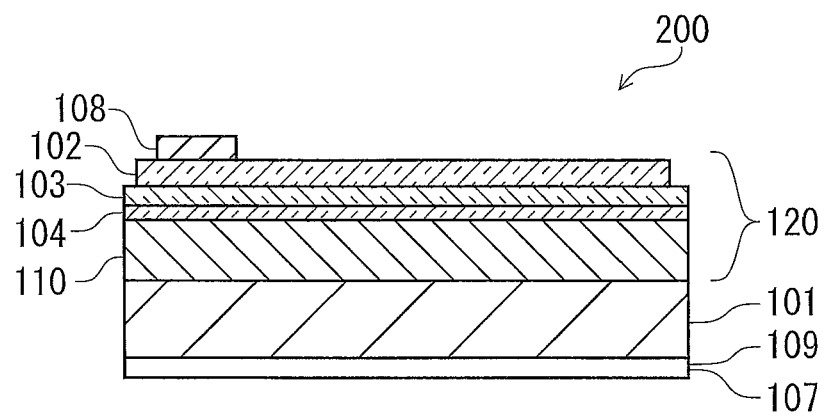
FIG. 2B is a schematic cross section showing the configuration of the semiconductor light emitting element according to the second embodiment, and is a cross section along IIB-IIB' line in FIG. 1A.

Next, a semiconductor element according to the second embodiment will be described. The semiconductor element according to the second embodiment is a semiconductor light emitting element. FIG. 2A is a schematic bottom view showing the configuration of the semiconductor light emitting element according to the second embodiment. FIG. 2B is a schematic cross section showing the configuration of the semiconductor light emitting element according to the second embodiment, and shows a cross section along the IIB-IIB' line in FIG. 2A. FIGS. 3A and 3B are schematic cross sections of the state of the oxide or nitride and the interface between the reflective layer and the carbide substrate of the semiconductor light emitting element according to the second embodiment.

Those components that are the same as in the first embodiment will not be described again.

Semiconductor Layer and Electrodes

The semiconductor light emitting element 200 includes a p-type nitride semiconductor layer 104, a light emitting layer 103, and an n-type nitride semiconductor layer 102, which are laminated via an adhesive layer 110 on the first main face of a carbide substrate 101. Furthermore, the semiconductor light emitting element 200 includes an n-side pad electrode 108 in part of the region on the n-type nitride semiconductor layer 102. It also includes a reflective layer 107, which also serves as a p-side full-surface electrode, on the second main face of the carbide substrate 101 opposite to the first main face.

As in the first embodiment, $In_XAl_YGa_{1-X-Y}N$ ($0 \leq X$, $0 \leq Y$, $X+Y<1$) or the like can be used to advantage, for example, as the material of the semiconductor layer. Silver, aluminum, nickel, rhodium, titanium, platinum, palladium, molybdenum, chromium, tungsten, copper, gold, or another such elemental metal, or alloys whose main components are these metals, can be used, for example as the material of the n-side pad electrode 108. Alternatively, it can also be a laminated structure made from the above-mentioned elemental metals or an alloy whose main components are these metals.

Carbide Substrate

The carbide substrate 101 is a joining substrate to be joined to the element structure separated from the crystal growth substrate. If the substrate is electroconductive, it is possible to employ an upper and lower electrode (counter electrode) structure. Also, it will be easier to supply power to the element structure uniformly in the plane, and the power efficiency will tend to be higher. Examples of the carbide substrate 101 include an SiC substrate with excellent thermal conductivity and electrical conductivity.

Joining Layer 110

The joining layer 110 is a layer that joins the carbide substrate 101 (the above-mentioned joining substrate) to a semiconductor layer 120 that is separated from the crystal growth substrate. This joining layer 110 preferably includes a metal reflective film or a dielectric multilayer film. Consequently, with the semiconductor light emitting element 200, light emitted from the element structure can be efficiently reflected upward by the metal reflective film or the dielectric multilayer film of the joining layer 110, and light emitted from the element structure will be less likely to travel through the interior of the substrate, allowing the light takeoff efficiency to be increased. Providing the metal reflective film or dielectric multilayer film of the joining layer 110 in contact with the element structure, or in contact with a transparent film such as a conductive oxide film provided in contact with the element structure, is preferable since its light reflection function will be enhanced. The metal reflective film used in the joining layer can be made of silver, aluminum, rhodium, platinum, gold, or an alloy of these, and the preferably, silver or a silver alloy is used because of their superior optical reflectivity. The dielectric multilayer film used in the joining layer can be, for example, the product of laminating two or more layers of one or more oxides or nitrides selected from among silicon, titanium, zirconium, niobium, tantalum, and aluminum, such as a laminated structure of $Nb_2O_5$ and $SiO_2$. The metal reflective film is provided to all or part of the joining layer, and the dielectric multilayer film is provided to part of the joining layer. When a metal reflective film or a dielectric multilayer film is provided to part of the joining layer, the other part of the joining layer can be constituted by gold, tin, platinum, palladium, rhodium, nickel, tungsten, molybdenum, chromium, titanium, alloys of these, or a combination thereof. The joining layer can be omitted when the substrate that is the joining substrate and the element structure that is separated from the crystal growth substrate are directly joined by surface activation joining, thermocompression joining, or the like.

Reflective Layer 107

The reflective layer 107 is the same as in the first embodiment. It is a silver alloy layer containing one or more types of particles selected from among oxides and nitrides, and is a layer that improves the light takeoff efficiency by increasing the reflectivity of light to the element structure side. It also functions as a p-side full-surface electrode. The reflective layer 107 may be a multilayer film or a single-layer film. The reflective layer 107 can be formed by sputtering, plating, vapor deposition, or another such method. The oxide or nitride 109 contained in the reflective layer 107 is distributed in granular form in the reflective layer 107, or adheres to the interface between the reflective layer 107 and the carbide substrate 101.

WORKING EXAMPLES

Working examples will now be given. FIGS. 5A to 5H are photographs taken from the film formation side after cross-cutting the film formation faces in Working Examples 1 to 6 and Comparative Examples 1 and 2.

Working Example 1

Adhesion evaluation samples were prepared as follows.

First, a reflective layer containing $Si_3N_4$ was formed in a thickness of 120 nm by co-sputtering using a silver target and an $Si_3N_4$ target, on the C plane of an SiC single crystal substrate. The RF power was 250 W in both cases of the simultaneous sputtering. Also, a nickel film was formed as a first metal film in a thickness of 100 nm, a rhodium film was formed as a second metal film in a thickness of 200 nm, and a gold film was formed as a third metal film in a thickness of 500 nm, in that order, by sputtering on the reflective layer. This formed a laminated film on the C plane of the SiC single crystal substrate.

Working Example 2

In the manufacturing process of Working Example 2, the light emitting element of Working Example 2 was manufactured in the same manner as in Working Example 1, except that a reflective layer containing ZnO was formed instead of the reflective layer containing $Si_3N_4$ of Working Example 1. The reflective layer containing ZnO was formed by co-sputtering using a silver target and a ZnO target. The RF power was 250 W in both cases of the simultaneous sputtering.

Working Example 3

In the manufacturing process of Working Example 3, the light emitting element of Working Example 3 was manufactured in the same manner as in Working Example 1, except that a reflective layer containing $TiO_2$ was formed instead of the reflective layer containing $Si_3N_4$ of Working Example 1. The reflective layer containing $TiO_2$ was formed by co-sputtering using a silver target and a $TiO_2$ target. The RF power was 250 W in both cases of the simultaneous sputtering.

Working Example 4

In the manufacturing process of Working Example 4, the light emitting element of Working Example 4 was manufactured in the same manner as in Working Example 1, except that a reflective layer containing $Ta_2O_5$ was formed instead of the reflective layer containing $Si_3N_4$ of Working Example 1. The reflective layer containing $Ta_2O_5$ was formed by co-sputtering using a silver target and a $Ta_2O_5$ target. The RF power was 250 W in both cases of the simultaneous sputtering.

Working Example 5

In the manufacturing process of Working Example 5, the light emitting element of Working Example 5 was manufactured in the same manner as in Working Example 1, except that a reflective layer containing $HfO_2$ was formed instead of the reflective layer containing $Si_3N_4$ of Working Example 1. The reflective layer containing $HfO_2$ was formed by co-sputtering using a silver target and an $HfO_2$ target. The RF power was 250 W in both cases of the simultaneous sputtering.

Working Example 6

In the manufacturing process of Working Example 6, the light emitting element of Working Example 6 was manufactured in the same manner as in Working Example 1, except that a reflective layer containing $In_2O_3$ was formed instead of the reflective layer containing $Si_3N_4$ of Working Example 1. The reflective layer containing $In_2O_3$ was formed by co-sputtering using a silver target and an $In_2O_3$ target. The RF power was 250 W in both cases of the simultaneous sputtering.

Comparative Example 1

In the manufacturing process of Comparative Example 1, the light emitting element of Comparative Example 1 was manufactured in the same manner as in Working Example 1, except that a pure silver layer was formed instead of the reflective layer containing $Si_3N_4$ of Working Example 1. The pure silver layer was formed by sputtering using only a silver target. The RF power was 500 W in this sputtering.

Comparative Example 2

In the manufacturing process of Comparative Example 2, the light emitting element of Comparative Example 2 was manufactured in the same manner as in Working Example 1, except that a reflective layer containing TiC was formed instead of the reflective layer containing $Si_3N_4$ of Working Example 1. The reflective layer containing TiC was formed by co-sputtering using a silver target and a TiC target. The RF power was 250 W in both cases of the simultaneous sputtering.

The film formation faces of the samples from the above Working Examples 1 to 6 and Comparative Examples 1 and 2 were cross-cut (JIS K 5600). The appearance after tape peeling was observed from the film formation side. Observation was performed using a Keyence Digital Microscope VHX-700F at a power of 25.

As a result, with Comparative Examples 1 and 2, a large amount pulled away at the interface between the SiC single crystal substrate and the reflective layer, whereas with Working Examples 1 to 6, there was no peeling of the respective reflective layer containing $Si_3N_4$, the reflective layer containing ZnO, the reflective layer containing $TiO_2$, the reflective layer containing $Ta_2O_5$, the reflective layer containing $HfO_2$, and the reflective layer containing $In_2O_3$. In the photographs of Comparative Examples 1 and 2 in FIGS. 5G and 5H, those areas of different brightness other than the cross-cut portions, as compared to the photographs of Working Examples 1 to 6, are areas where peeling occurred.

Thus, with the semiconductor element in the embodiments disclosed herein, there is good adhesion between the carbide substrate and the reflective layer, and separation is less likely to occur at the reflective layer. Also, with the method for manufacturing a semiconductor element in the embodiments disclosed herein, a semiconductor element can be manufactured with which there is good adhesion between the carbide substrate and the reflective layer, and separation is less likely to occur at the reflective layer.

The semiconductor element and semiconductor element manufacturing method according to the present invention were described in specific terms above by embodiments of the invention, but the gist of the present invention is not limited to or by these descriptions, and should be interpreted broadly based on the description of the patent claims. Also, it should go without saying that various modifications, alterations, and so forth based on these descriptions are also included in gist of the present invention.

INDUSTRIAL APPLICABILITY

The semiconductor element according to the embodiments disclosed herein can be utilized in all semiconductor light emitting devices that make use of light emitting elements, such as various kinds of lighting fixture, automotive lighting, displays, and indicator. Also, in addition to devices that make use of light elements such as light receiving devices, the present invention can also be applied to a power transistor or other such a semiconductor device or semiconductor electronic device.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a semiconductor element, comprising:
   providing a semiconductor layer on a carbide substrate via a joining layer, the joining layer including a metal reflective film and being provided between the semiconductor layer and the carbide substrate so as to be in contact with both of the semiconductor layer and the carbide substrate, the carbide substrate having a joining layer contact surface connected to the joining layer and a reflective layer contact surface opposite to the joining layer contact surface; and
   providing a reflective layer on the reflective layer contact surface of the carbide substrate, the reflective layer containing silver and at least one of oxide particles and nitride particles.

2. The method according to claim 1, wherein the reflective layer is provided via sputtering or vapor deposition.

3. The method according to claim 1, wherein the reflective layer is provided via simultaneous sputtering using a silver target and an oxide target, sputtering using an alloy target including silver and an oxide, or vapor deposition using an alloy vapor deposition material including silver and an oxide.

4. The method according to claim 1, wherein the reflective layer is provided via simultaneous sputtering using a silver target and a nitride target, sputtering using an alloy target including silver and a nitride, or vapor deposition using an alloy vapor deposition material including silver and a nitride.

5. The method according to claim 1, wherein the reflective layer is provided via disposing the at least one of oxide particles and nitride particles to be in contact with the carbide substrate or to be in a vicinity of a boundary between the carbide substrate and the reflective layer.

6. The method according to claim 1, wherein the at least one of oxide particles and nitride particles are dispersed in the reflective layer.

7. The method according to claim 1, wherein the at least one of oxide particles and nitride particles are distributed in a vicinity of a boundary between the carbide substrate and the reflective layer.

8. The method for manufacturing a semiconductor element according to claim 1, wherein the amount in which the at least one of oxide particles and nitride particles are contained in the reflective layer is at least 0.01 wt % and no more than 5 wt % with respect to the total weight of the reflective layer.

9. The method for manufacturing a semiconductor element according to claim 1, wherein the at least one of the oxide particles and nitride particles include at least one of $Si_3N_4$, $ZnO$, $TiO_2$, $Ta_2O_5$, $HfO_2$, and $In_2O_3$.

10. The method for manufacturing a semiconductor element according to claim 1, wherein the semiconductor element is a semiconductor light emitting element.

11. The method according to claim 1,
wherein the silver and the at least one of oxide particles and nitride particles provided at an interface between the reflective layer and the carbide substrate, and
wherein the at least one of the oxide particles and the nitride particles are in contact with the carbide substrate along with the silver.

12. The method according to claim 11, wherein, at the interface between the reflective layer and the carbide substrate, the at least one of the oxide particles and the nitride particles is linked in a reticulated form.

13. The method according to claim 11, wherein, at the interface between the reflective layer and the carbide substrate, a pseudo transition later is disposed in which the at least one of the oxide particles and the nitride particles is formed as islands.

14. The method according to claim 1, wherein, the reflective layer contains the silver and a mixture of the oxide particles and the nitride particles.

15. The method according to claim 14,
wherein the mixture of oxide particles and nitride particles provided at an interface between the reflective layer and the carbide substrate, and
wherein the mixture of the oxide particles and the nitride particles is in contact with the carbide substrate along with the silver.

16. The method according to claim 15, wherein, at the interface between the reflective layer and the carbide substrate, the at least one of the oxide particles and the nitride particles are linked in a reticulated form.

17. The method according to claim 15, wherein, at the interface between the reflective layer and the carbide substrate, a pseudo transition later is disposed in which the at least one of the oxide particles and the nitride particles is formed as islands.

* * * * *